United States Patent
You

(10) Patent No.: US 10,411,419 B2
(45) Date of Patent: Sep. 10, 2019

(54) SELF-ALIGNING ELECTRICAL CONNECTOR

(71) Applicant: Siemens Healthcare GmbH, Erlangen (DE)

(72) Inventor: Jun You, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 15/934,373

(22) Filed: Mar. 23, 2018

(65) Prior Publication Data

US 2018/0277998 A1   Sep. 27, 2018

(30) Foreign Application Priority Data

Mar. 24, 2017 (CN) ..................... 2017 2 0300287 U

(51) Int. Cl.
*H01R 13/631* (2006.01)
*H01R 13/24* (2006.01)
*H01R 24/76* (2011.01)
*G01R 33/36* (2006.01)

(52) U.S. Cl.
CPC ............. *H01R 24/76* (2013.01); *G01R 33/36* (2013.01); *H01R 13/24* (2013.01); *H01R 13/2421* (2013.01); *H01R 13/6315* (2013.01); *H01R 2201/12* (2013.01)

(58) Field of Classification Search
CPC ................ H01R 13/6315; H01R 13/24; H01R 13/2421–2201/12; G01R 33/36
See application file for complete search history.

(56) References Cited

U.S. PATENT DOCUMENTS

2002/0048982 A1\* 4/2002 Gu ..................... H01R 13/6315
439/247

\* cited by examiner

*Primary Examiner* — Vanessa Girardi
(74) *Attorney, Agent, or Firm* — Schiff Hardin LLP

(57) ABSTRACT

A medical device self-aligning connector is disposed on a medical device cover, and has a moving connection body, passing through a hole formed in the medical device cover, and having multiple connection elements that electrically connect to a target component. The connector further has a base that supports the moving connection body, and an elastic body that press-connects the moving connection body to the medical device cover. The moving connection body is designed to cause a certain gap to exist between the moving connection body and the hole, and moves within the range of the gap.

10 Claims, 4 Drawing Sheets

SELF-ALIGNING ELECTRICAL CONNECTOR

BACKGROUND OF THE INVENTION

Field of the Invention

The present invention concerns a medical device self-aligning connector, and a medical device having such a connector.

Description of the Prior Art

A conventional magnetic resonance local radio frequency (RF) coil generally is composed of two basic parts. When the coil is used for magnetic resonance imaging, a connector must be used to connect the two parts together. Since multiple RF signals must be transmitted, a pin connector is generally used for the local coil. FIG. 4 shows a known pin connector 100. The pin connector 100 has a pin module 110 and a socket module 120. The pin module 110 has multiple pins 111, and the socket module 120 has multiple sockets 121. When it is desired to use the connector 100 and the pins 111 are inserted into the sockets 121, if the pins 111 have not been properly aligned with the sockets 121 as shown in FIG. 4, there will be increased friction, making the task of insertion and removal laborious. Moreover, since the connection between the pins and sockets is rigid, problems such as bending of the pins 111 will sometimes occur under the action of very high pressure.

SUMMARY OF THE INVENTION

In view of the above, a medical device connector in accordance with the invention achieves self-alignment using a simple structure. A medical device in accordance with the invention has such a connector.

In an embodiment of the present invention, a medical device self-aligning connector is designed to be disposed on a medical device cover, and has a moving connection body that passes through a hole formed in the medical device cover, and multiple connection elements that electrically connect to a target component. The connector further has a base that supports the moving connection body, and an elastic body that press-connects the moving connection body to the medical device cover. The moving connection body produces a certain gap between the moving connection body and the hole, and moves within the range of the gap.

In the medical device self-aligning connector, preferably the moving connection body has a main connecting body and a slide plate, the main connecting body having the connection elements. The slide plate is disposed between the base and the medical device cover, and the elastic body press-connects the slide plate to the medical device cover.

In the medical device self-aligning connector, preferably a first insertion-engaged part is provided on a surface of the medical device cover that is connected to the slide plate, a first insertion-engaging part is provided on the slide plate in a position corresponding to the first insertion-engaged part, and the first insertion-engaging part is slidably insertion-engaged with the first insertion-engaged part.

In the medical device self-aligning connector, preferably a second insertion-engaged part is provided on a surface of the slide plate that faces the elastic body, and the elastic body has a second insertion-engaging part that is slidably insertion-engaged with the second insertion-engaged part.

In the medical device self-aligning connector, preferably the first insertion-engaged part is either a protrusion or a recess, and the first insertion-engaging part is the other of a protrusion or a recess.

In the medical device self-aligning connector, preferably the second insertion-engaged part is one of a protrusion or a recess, and the second insertion-engaging part is the other of a protrusion or a recess.

In the medical device self-aligning connector, preferably the main connecting body and the slide plate are integrally formed or each formed independently.

In the medical device self-aligning connector, preferably the moving connection body is one of a plug or a jack.

In the medical device self-aligning connector, preferably the elastic body has a spring and a push-head to which the spring applies a force, or the elastic body is a spring.

In addition, the present invention encompasses a medical device, having the medical device self-aligning connector.

According to the invention, the self-aligning medical device connector and the medical device having same are realized using a simple structure.

DESCRIPTION OF THE PREFERRED EMBODIMENTS

Figure 1:
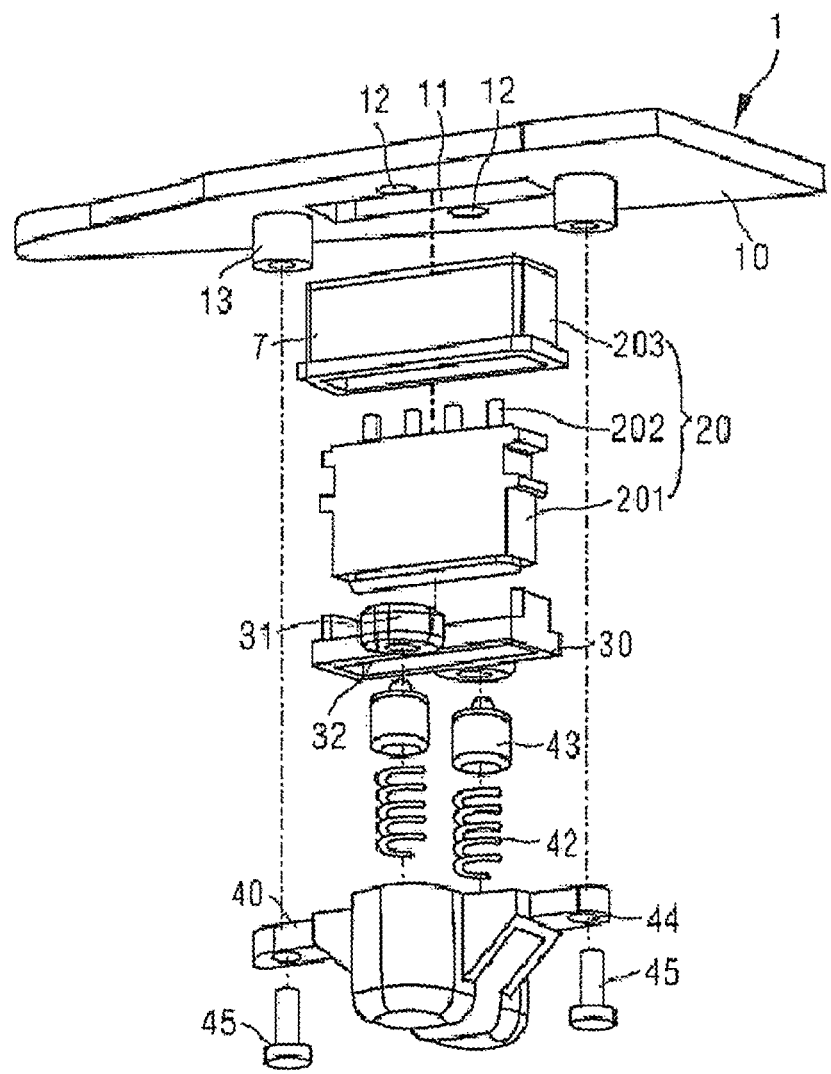
FIG. 1 is a three-dimensional illustration of a self-aligning connector in an embodiment of the present invention.

The present invention is explained in detail below by a number of embodiments.

As used herein, "schematic" means "serving as an, example or illustration". No drawing or embodiment described herein as "schematic" should be interpreted as a more preferred or more advantageous technical solution.

To make the drawings uncluttered, only those parts relevant to the present invention are shown schematically in the drawings; they do not represent the actual structure thereof as a product. Furthermore, to make the drawings uncluttered for ease of understanding, in the case of components having the same structure or function in certain drawings, only one of these is drawn schematically, or only one is provided with a reference numeral.

FIG. 1 shows a three-dimensional drawing of an embodiment of the self-aligning connector 1 according to the invention. The self-aligning connector 1 is disposed on a coil cover 10, and has a plug (main connecting body) 20, a slide plate 30 and a base 40. An opening 11 for the plug 20 to pass through is provided in the center of the coil cover 10. Moreover, first recesses 12 and threaded holes 13 are provided on a surface of the coil cover 10 that is opposite the slide plate 30.

The plug 20 has a pin block 201, and pins 202 for electrically connecting to sockets (see FIG. 3); the pin block 201 is substantially cuboid-shaped, with the pins 202 are disposed at one end thereof. Moreover, the plug 20 also has a pin cover 203; the pin cover 203 being in the shape of a cuboid with openings at two. The pin block 201 is accommodated in the pin cover 203, and the pins 202 are exposed through the opening at one end of the pin cover 203.

Figure 2:
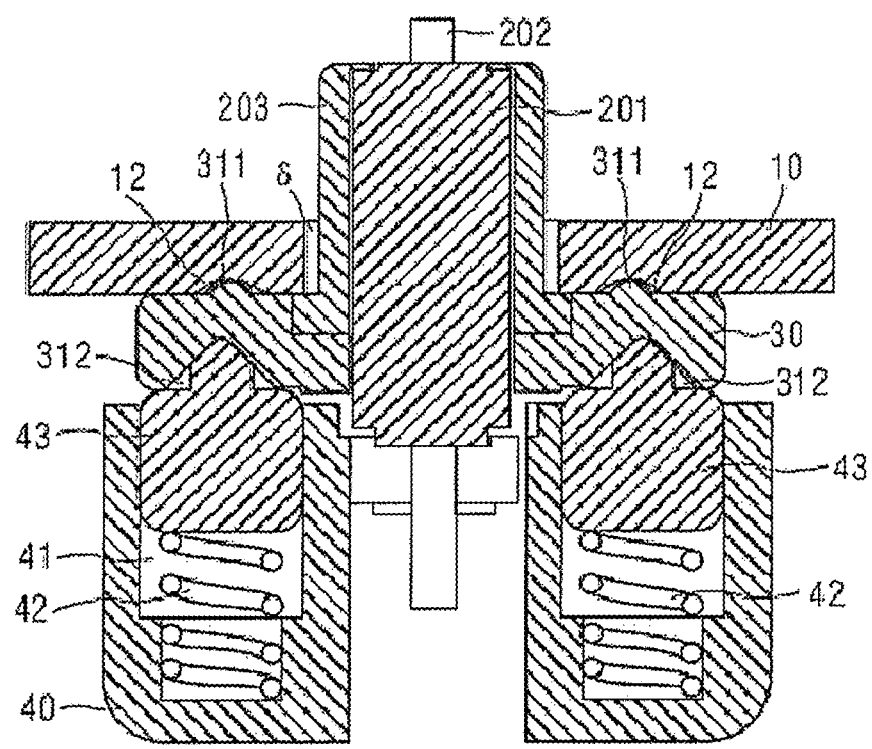
FIG. 2 is a sectional side view of the self-aligning connector of FIG. 1.

The slide plate 30 is substantially in the form of a rectangular plate, and supports the opposite end of the pin block 201 (the end of the pin block 201 where pins 202 are not disposed). Moreover, two protruding parts 31, projecting outward from the slide plate 30, are provided at long edges of the slide plate 30. The two protruding parts 31 have the same structure, so only one of them is described here. as shown in FIG. 2, a protrusion 311 is provided on a surface of the protruding part 31 that is opposite the coil cover 10, and a second recess 312 is provided on another surface on the opposite side to the surface on which the protrusion 311 is formed. In this embodiment, the second recess 312 is for example formed as a conical surface. A slot 32 for supporting the other end of the pin block 201 is formed in substantially the center of the slide plate 30.

The base 40 is formed so as to have a pair of tubular cavities 41. One end of the cavity 41 is closed, while the other end is open, and a spring 42 and a push-head 43 are accommodated in the cavity 41. The push-head 43 has a semicircular protrusion at a top end of a cylindrical main body of the push-head 43. Moreover, the base 40 is provided with through-holes 44, and screws 45 are passed through the through-holes 44 and screwed into the threaded holes 13 of the coil cover 10, thereby fixing the base 40 to the coil cover 10.

FIG. 2 shows a sectional side view of the self-aligning connector 1 of this embodiment. The structure of the self-aligning connector 1 is explained further below with reference to FIG. 2.

An elastic body is disposed in the tubular cavity 41 of the base 40. In this embodiment, the elastic body is formed by the spring 42 and the push-head 42. The protrusion of the push-head 43 is inserted into the second recess 312 of the slide plate 30, and can slide in the second recess 312. The protrusion of the push-head 43 and the second recess 312 thus form engaging parts. The spring 42 applies a force to the push-head 43 in the direction of the slide plate 30. That end of the pin block 201, which is provided with the pins 202, is passed through the opening at one end of the pin cover 203, and the other end of the pin block 201 is disposed in the slot 32 of the slide plate 30. At the same time, the opening at the other end of the pin cover 203 is insertion-engaged with a substantially central part of the slide plate 30. The plug 20 and slide plate 30 are thereby fitted together. The assembled plug 20 is then passed through the opening 11 of the coil cover 10, such that the pins 202 protrude to a connecting jack (shown in FIG. 3) of a coil situated inside the coil cover 10. There is a gap δ between the pin cover 203 of the plug 20 and the opening 11 of the coil cover 10. Furthermore, the protrusion 311 on one surface of the protruding part 31 is inserted into the first recess 12 formed on that surface of the coil cover 10 which is opposite thereto. The protrusion 311 and the first recess 12 thus form further engaging parts.

Figure 3:
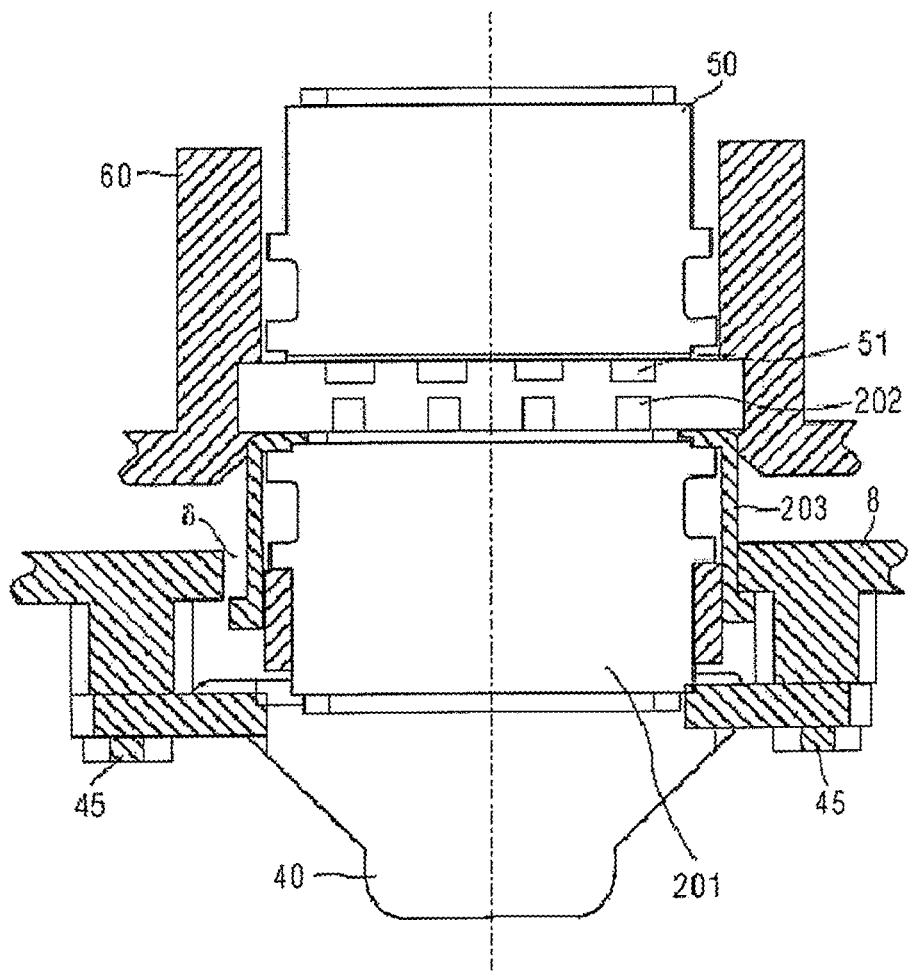
FIG. 3 illustrates the medical device self-aligning connector in accordance with the invention, in a connection state.
Figure 4:
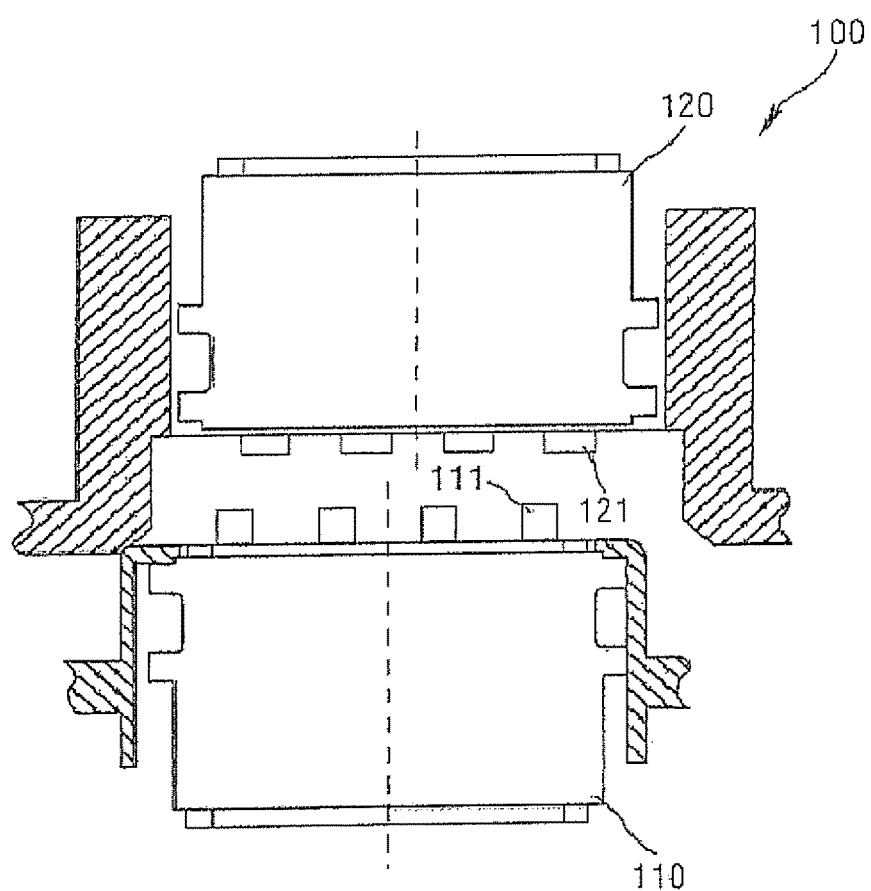
FIG. 4 illustrates a medical device connector in the prior art.

An operational state of the medical device self-aligning connector 1 to which this embodiment relates is explained below with reference to FIG. 3.

When a medical device self-aligning connector of the present application, for example the lower coil plug 1, is inserted into an upper coil jack 1 (in this embodiment, the jack 2 is formed by a jack body 50 and a coil cover 60), if the pins 202 of the coil plug 1 are not aligned with sockets 51 of the jack body 50, then the plug 20 abuts the coil cover 60 of the jack 2, and the plug 20 is caused to slide within the range of the gap δ. At the same time, the plug 20 drives the slide plate 30 to move, and the protrusion 311 of the slide plate 30 then slides in the first recess 12 formed on the coil cover 60. The slide plate 30 is then pushed such that the push-head 43 moves in a direction causing compression of the spring 42, until the pins 202 of the plug 20 are aligned with the sockets 51 of the jack body 50. When the plug 1 is pulled off the jack 2, the spring 42 is reset to an original position, and the push-head 43 returns to an original position of the second recess 312, then pushing the slide plate 30 to slide, such that the protrusion 311 is reset so as to be located in an original position of the first recess 12. Thus, once the plug 1 is pulled off the jack 2, the plug 20 is reset to an initial, original position.

According to the embodiments of the present invention described above, the plug 20 can be moved within the range of the gap δ, such that the pins 202 of the plug 201 are aligned with the sockets 51 of the jack body 50, and at the same time the plug 20 drives the slide plate 30, such that the slide plate 30 slides along the coil cover 10. Thus friction can be reduced when the plug 1 is connected to the jack 2, so that insertion and removal are more convenient, in turn avoiding the undesirable situation whereby the pins are bent due to pressure caused by a rigid connection when the pins are not aligned with the sockets.

In the description of the embodiments above, a plug (and the pins thereof) is used as a connecting element of the medical device self-aligning connector, and the jack (and the sockets thereof) is used as a target component. The structure would also be suitable for a jack as the connecting element. In addition, in this embodiment, the plug 20 and the slide plate 30 form a movable connection body, and the case where the plug 20 and the slide plate 30 are formed separately is taken as an example for the purposes of explanation; however, the plug 20 and the slide plate 30 could also be integrally formed. In addition, the case where the first recess 12 is formed on the coil cover 10, and the protrusion 311 slidably insertion-engaged with the first recess 12 is formed on the slide plate 30, is taken as an example for the purposes of explanation; however, it would also be possible for a protrusion to be formed on the coil cover 10, and for a recess slidably insertion-engaged with the protrusion to be formed on the sliding plate 30.

In addition, in the embodiments described above, the case where the elastic body comprises the spring 42 and the push-head 43 is illustrated; however, this is not a limitation, and it would also be possible for no push-head 43 to be provided, so that the sliding plate 30 is pushed directly by the spring 42.

In addition, in the embodiments described above, the case where the self-aligning connector is disposed on a coil is taken as an example for the purpose of explanation, but the structure of the self-aligning connector of the present utility model is not restricted to being used for a coil, and could of course be used for a connector requiring aligned connection in a medical device or in another component part of a medical device.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A self-aligning electrical connector assembly that makes an electrical connection with a target component that is covered by a device cover having a cover opening therein through which said target component is accessible, said electrical connector assembly comprising:

a movable connector body designed to pass through said cover opening in an insertion direction;

a base comprising a cavity having a spring therein and a sliding element connected to said spring that slides in said cavity along said insertion direction according to a force applied thereto by said spring;

a slide plate that mechanically connects said base to said movable connector body with said sliding element abutting said slide plate, said slide plate having a slide plate opening therein in which said movable connector body is movable along said insertion direction and that is larger than said movable connector body so that a gap exists between said movable connector body and said slide plate opening in a plane that is intersected by said insertion direction, thereby allowing lateral movement of said movable connector body in said slide plate opening while said movable connector body is passing through said cover opening so as to bring said movable connector body into alignment with said target component in order to make said electrical connection; and said sliding element and said slide plate having respective engaging elements that engage each other so as to keep said force applied by said spring aligned with said intersection direction, with no bending of said spring, as said movable connector body passes through said cover opening, despite said lateral movement of said movable connector body.

2. A self-aligning electrical connector assembly as claimed in claim 1 wherein said engaging elements comprise a protrusion on said sliding element and a corresponding recess in a surface of said slide element that faces said base.

3. A self-aligning electrical connector assembly as claimed in claim 1 wherein said target component comprises electrical sockets and wherein said movable connector body comprises electrical pins that are respectively received in said electrical sockets.

4. A self-aligning electrical connector assembly as claimed in claim 1 wherein said slide plate and said device cover comprise further respective engaging elements that engage each other so as to also keep said spring force aligned with said insertion direction as said movable connector body passes through said cover opening, despite said lateral movement of said movable connector body.

5. A self-aligning electrical connector assembly as claimed in claim 4 wherein said respective further engaging elements comprise a protrusion on a surface of said slide plate that faces said device cover, and a corresponding recess in said device cover.

6. A device comprising:
a target component that is covered by a device cover having a cover opening therein through which said target component is accessible;

a self-aligning electrical connector assembly that makes an electrical connection with said target component;

said self-aligning electrical connector assembly comprising a movable connector body designed to pass through said cover opening in an insertion direction;

said self-aligning electrical connector assembly comprising a base comprising a cavity having a spring therein and a sliding element connected to said spring that slides in said cavity along said insertion direction according to a force applied thereto by said spring;

said self-aligning electrical connector assembly comprising a slide plate that mechanically connects said base to said movable connector body with said sliding element abutting said slide plate, said slide plate having a slide plate opening therein in which said movable connector body is movable along said insertion direction and that is larger than said movable connector body so that a gap exists between said movable connector body and said slide plate opening in a plane that is intersected by said insertion direction, thereby allowing lateral movement of said movable connector body in said slide plate opening while said movable connector body is passing through said cover opening so as to bring said movable connector body into alignment with said target component in order to make said electrical connection; and said sliding element and said slide plate having respective engaging elements that engage each other so as to keep said force applied by said spring aligned with said intersection direction, with no bending of said spring, as said movable connector body passes through said cover opening, despite said lateral movement of said movable connector body.

7. A device as claimed in claim 6 wherein said engaging elements comprise a protrusion on said sliding element and a corresponding recess in a surface of said slide element that faces said base.

8. A device as claimed in claim 6 wherein said target component comprises electrical sockets and wherein said movable connector body comprises electrical pins that are respectively received in said electrical sockets.

9. A device as claimed in claim 6 wherein said slide plate and said device cover comprise further respective engaging elements that engage each other so as to also keep said spring force aligned with said insertion direction as said movable connector body passes through said cover opening, despite said lateral movement of said movable connector body.

10. A device as claimed in claim 9 wherein said respective further engaging elements comprise a protrusion on a surface of said slide plate that faces said device cover, and a corresponding recess in said device cover.

* * * * *